United States Patent
Xiang et al.

(10) Patent No.: US 7,033,869 B1
(45) Date of Patent: Apr. 25, 2006

(54) STRAINED SILICON SEMICONDUCTOR ON INSULATOR MOSFET

(75) Inventors: Qi Xiang, San Jose, CA (US);
Jung-Suk Goo, Stanford, CA (US);
James N. Pan, Fishkill, NY (US)

(73) Assignee: Advanced Micro Devices, Sunnyvale, CA (US)

( * ) Notice: Subject to any disclaimer, the term of this patent is extended or adjusted under 35 U.S.C. 154(b) by 193 days.

(21) Appl. No.: 10/755,896

(22) Filed: Jan. 13, 2004

(51) Int. Cl.
*H01L 21/00* (2006.01)
*H01L 21/84* (2006.01)
*H01L 27/01* (2006.01)
*H01L 27/12* (2006.01)

(52) U.S. Cl. .................. 438/149; 257/347
(58) Field of Classification Search ........... 438/149; 257/347
See application file for complete search history.

(56) References Cited

U.S. PATENT DOCUMENTS

| 6,310,367 B1 * | 10/2001 | Yagishita et al. | 257/190 |
| 6,509,234 B1 * | 1/2003 | Krivokapic | 438/270 |
| 2002/0053711 A1 * | 5/2002 | Chau et al. | 257/412 |

\* cited by examiner

*Primary Examiner*—George Eckert
*Assistant Examiner*—Deloris Bryant
(74) *Attorney, Agent, or Firm*—Foley & Lardner LLP

(57) ABSTRACT

An SOI substrate comprises a layer of strained silicon sandwiched between a dielectric layer and a layer of strained silicon. The substrate may be used to form a strained silicon SOI MOSFET having a gate electrode that extends through the silicon germanium layer to a channel region formed in the strained silicon layer. The MOSFET may be formed in a fully depleted state by using a strained silicon layer of appropriate thickness.

12 Claims, 10 Drawing Sheets

STRAINED SILICON SEMICONDUCTOR ON INSULATOR MOSFET

BACKGROUND OF THE INVENTION

1. Field of the Invention

The present invention relates generally to fabrication of metal oxide semiconductor field effect transistors (MOSFETs), and, more particularly, to MOSFETs that achieve improved carrier mobility through the incorporation of strained silicon.

2. Related Technology

MOSFETs are a common component of integrated circuits (ICs). FIG. 1 shows a cross sectional view of a conventional MOSFET device. The MOSFET is fabricated on a silicon substrate 10 within an active region bounded by shallow trench isolations 12 that electrically isolate the active region of the MOSFET from other IC components fabricated on the substrate 10.

The MOSFET is comprised of a gate 14 and a channel region 16 that are separated by a thin gate insulator 18 such as silicon oxide or silicon oxynitride. A voltage applied to the gate 14 controls the creation of an inversion layer that provides carriers for conduction in the channel region 16 between source and drain regions. To minimize the resistance of the gate 14, the gate 14 is typically formed of a heavily doped semiconductor material such as polysilicon.

The source and drain regions of the MOSFET comprise deep source and drain regions 20 formed on opposing sides of the channel region 16. The deep source and drain regions 20 are formed by ion implantation subsequent to the formation of a spacer 22 around the gate 14. The spacer 22 serves as a mask during implantation to define the lateral positions of the deep source and drain regions 20 relative to the channel region 16.

The source and drain regions of the MOSFET further comprise shallow source and drain extensions 24. As dimensions of the MOSFET are reduced, short channel effects resulting from the small distance between the source and drain cause degradation of MOSFET performance. The use of shallow source and drain extensions 24 rather than deep source and drain regions near the ends of the channel 16 helps to reduce short channel effects. The shallow source and drain extensions 24 are implanted after the formation of a protective layer 26 around the gate 14 and over the substrate, and prior to the formation of the spacer 22. The gate 14 and the protective layer 26 act as an implantation mask to define the lateral position of the shallow source and drain extensions 24 relative to the channel region 16. Diffusion during subsequent annealing causes the shallow source and drain extensions 24 to extend slightly beneath the gate 14.

Source and drain silicides 28 are formed on the deep source and drain regions 20 to provide ohmic contacts and reduce contact resistance. The suicides 28 are comprised of the substrate semiconductor material and a metal such as cobalt (Co) or nickel (Ni). The deep source and drain regions 20 are formed deeply enough to extend beyond the depth to which the source and drain suicides 28 are formed. The gate 14 likewise has a silicide 30 formed on its upper surface. A gate structure comprising a polysilicon material and an overlying silicide as shown in FIG. 1 is sometimes referred to as a polycide gate.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. Since the atoms of the silicon lattice align with the more widely spaced silicon germanium lattice, a tensile strain is created in the silicon layer. The silicon atoms are essentially pulled apart from one another. The amount of tensile strain applied to the silicon lattice increases with the proportion of germanium in the silicon germanium lattice.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET incorporating a strained silicon layer is shown in FIG. 2. The MOSFET is fabricated on a substrate comprising a silicon germanium layer 32 grown on a silicon layer 10. An epitaxial layer of strained silicon 34 is grown on the silicon germanium layer 32. The MOSFET uses conventional MOSFET structures including deep source and drain regions 20, shallow source and drain extensions 24, a gate oxide layer 18, a gate 14 surrounded by a protective layer 26, a spacer 22, source and drain silicides 28, a gate silicide 30, and shallow trench isolations 12. The channel region of the MOSFET includes the strained silicon material, which provides enhanced carrier mobility between the source and drain.

An alternative to the formation of devices on semiconductor substrates is silicon on insulator (SOI) construction. In SOI construction, MOSFETs are formed on a substrate that includes a layer of a dielectric material beneath the MOSFET active regions. SOI devices have a number of advantages over devices formed in a semiconductor substrate, such as better isolation between devices, reduced leakage current, reduced latch-up between CMOS elements, reduced chip capacitance, and reduction or elimination of short channel coupling between source and drain regions.

FIG. 3 shows an example of a strained silicon MOSFET formed on an SOI substrate. In this example, the MOSFET is formed on an SOI substrate that comprises a silicon germanium layer 32 provided on a dielectric layer 36. The MOSFET is formed within an active region defined by trench isolations 12 that extend through the silicon germanium layer 32 to the underlying dielectric layer 36. The SOI substrate may be formed by a buried oxide (BOX) method or by a wafer bonding method. In one alternative to the SOI construction shown in FIG. 3, strained silicon FinFETs comprised of monolithic silicon germanium FinFET bodies having strained silicon grown thereon may be patterned from the silicon germanium layer of the SOI substrate.

FIGS. 4a–4d show structures formed in accordance with a wafer bonding method. FIG. 4a shows a substrate that includes a planarized layer of silicon germanium 38. The silicon germanium is typically grown on a silicon wafer (not shown). The silicon germanium 38 is implanted with hydrogen 40 to form a hydrogen rich region 42 within the silicon germanium material. The hydrogen 40 is implanted with an energy such that the amount of silicon remaining above the hydrogen rich region exceeds the thickness of the silicon germanium layer to be formed on the SOI substrate. In some applications a different material such as oxygen may be implanted. FIG. 4b shows the silicon germanium layer 38 of FIG. 4a after being cleaned, stripped of oxide in a diluted HF solution, rinsed in deionized water to form an active native oxide on its surface, and then inverted and bonded to a planarized oxide layer 46 formed on a semiconductor layer 48 of a second substrate 44. To facilitate bonding, adjoining surfaces of the substrates are planarized to a homogeneity of 0.5 microns or less.

Bonding is generally performed in two stages. In a first stage, the substrates are heated to approximately 600 degrees C. in an inert environment for approximately three hours. As shown in FIG. 4c, the heating of the first stage causes bonding of the silicon germanium layer 38 to the dielectric layer 46 of the second substrate 44 due to Van der Waals forces. The heating of the first stage also causes the silicon germanium layer 38 to fracture in the hydrogen rich region 42. After the first heating stage the fractured portion of the silicon germanium layer may be removed, leaving a new substrate comprising a silicon germanium layer 50 bonded to an oxide layer 46, and having a residual hydrogen rich region 42 at its upper surface. In a second stage of the bonding process, the bonded structure is heated to approximately 1050–1200 degrees C. for 30 minutes to two hours to strengthen the bond between the dielectric layer 46 and the silicon germanium layer 50. The resulting substrate is then planarized and cleaned, leaving a silicon germanium SOI substrate as shown in FIG. 4d.

One problem with conventional strained silicon devices is that growth of the strained silicon layer on the substrate prior to formation of MOSFET elements causes a significant amount of the strained silicon to be consumed during subsequent processing. Another problem is the formation of "misfit dislocations" in the strained silicon that effectively release the strain applied to the silicon lattice. Misfit dislocations are primarily caused by mismatches between the strained silicon lattice and the lattice of the underlying silicon germanium supporting layer. The amount of misfit dislocations in a strained silicon layer may be increased as the result of thermal factors. One instance in which misfit dislocations may be caused by thermal factors is during cooling after deposition of a strained silicon layer. Another instance in which misfit dislocations may occur is during exposure to high temperatures, e.g. 1000 degrees C. and higher, which are often employed for forming elements such as shallow trench isolations. Such high temperatures are believed to cause depletion of the germanium content of the silicon germanium substrate, leading to formation of misfit dislocations in the overlying strained silicon. The rate of formation of misfit dislocations rises exponentially with increases in temperature.

It has been determined that a strained silicon layer has a critical thickness, above which misfit dislocations become significantly more likely to occur. The critical thickness depends on the amount of tensile strain applied to the silicon lattice, and thus on the germanium content of the underlying silicon germanium layer. For example, it has been determined that a silicon germanium layer having approximately 20% germanium content can support a critical thickness of approximately 200 Angstroms without the risk of significant misfit dislocations, whereas a silicon germanium layer having approximately 30% germanium content can support a critical thickness of only approximately 80 Angstroms.

Therefore the application of current strained silicon technology to MOSFET design is constrained by conflicting limitations, in that strained silicon carrier mobility is enhanced by an increase in the germanium content of the underlying layer, yet the critical thickness of the strained silicon is reduced by an increase of the germanium content of the underlying layer. These conflicts make practical applications difficult to achieve. For example, it has been determined empirically that at least approximately 70 Angstroms of strained silicon are required to provide a meaningful improvement in MOSFET performance. However, in order to account for consumption of silicon during conventional processing, a layer of approximately double that thickness must be formed initially, and to avoid misfit dislocation in a layer of such thickness, the germanium content of the underlying layer must be restricted to approximately 20%. The resulting strain applied to the strained silicon layer has been found to have relatively little effect on hole mobility, and therefore it is difficult to provide a meaningful application of strained silicon in PMOS devices. In addition to the foregoing considerations, the tensile strain of the strained silicon layer and hence its carrier mobility may be further degraded through the formation of misfit dislocations caused by both the increases and the decreases in temperature that are typically encountered during processing, such as during formation of shallow trench isolations. Therefore, while the limiting factors of strained silicon technology can be balanced to achieve limited carrier mobility enhancement in some applications, current technology does not offer a way to impart enough strain to produce significant carrier mobility enhancement without also introducing mobility-reducing defects and strain relaxation.

An additional complication of strained silicon technology is that it is difficult to form fully depleted SOI devices with strained silicon channels. Fully depleted SOI MOSFETs are preferably implemented as devices in which the thickness of the semiconductor material in the channel region is less than the thickness of the depletion region. However, given the need to provide a supporting layer of silicon germanium beneath the strained silicon channel, the total channel thickness becomes greater than that of the depletion region, or the thickness of strained silicon is not sufficient to provide significant mobility enhancement.

SUMMARY OF THE INVENTION

In accordance with embodiments of the invention, an SOI substrate comprises a layer of strained silicon sandwiched between a dielectric layer and a layer of silicon germanium. The substrate may be used to form a strained silicon SOI MOSFET having a gate electrode that extends through the silicon germanium layer to a channel region formed in the strained silicon layer. The MOSFET may be formed in a fully depleted state by using a strained silicon layer of appropriate thickness.

In accordance with one embodiment of the invention, an SOI substrate is formed. Initially a layer of silicon germanium is grown in a first substrate. A layer of strained silicon is then grown on the silicon germanium layer, and hydrogen is implanted into the silicon germanium to create a hydrogen implanted layer. The strained silicon layer is then bonded to a dielectric layer of a second substrate, and the silicon germanium layer is fractured at the hydrogen implanted layer. The fractured portion is removed, and the surface of the silicon germanium layer is planarized.

In accordance with another embodiment, a strained silicon SOI device is formed. Initially a substrate is provided. The substrate comprises a strained silicon layer formed on a dielectric layer and a silicon germanium layer formed on the strained silicon layer. A dummy gate is formed on the silicon germanium layer and a protective layer is formed over the dummy gate. The protective layer is planarized to expose the dummy gate, and the dummy gate is then removed. A trench is etched in the silicon germanium layer at the location of the dummy gate to expose the strained silicon layer, and a dielectric spacer is formed in the trench. A gate insulator is then formed on the strained silicon and a gate electrode is formed on the gate insulator.

DESCRIPTION OF THE DRAWINGS

Embodiments of the invention are described in conjunction with the following drawings, in which.

DETAILED DESCRIPTION OF PREFERRED EMBODIMENTS

Figure 1:
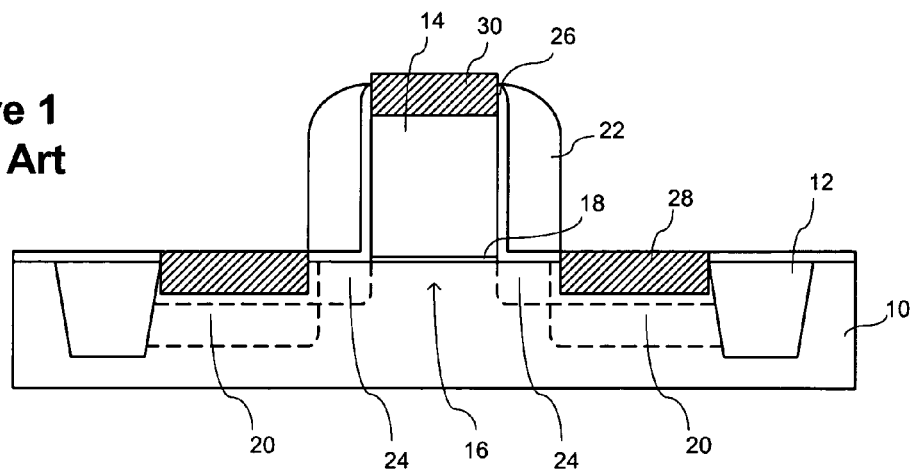
FIG. 1 shows a conventional MOSFET formed in accordance with conventional processing.
Figure 2:
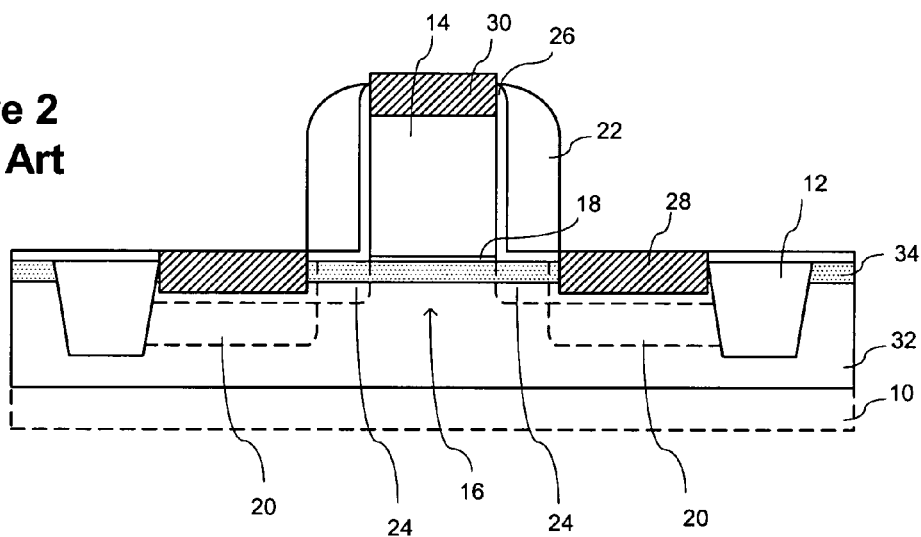
FIG. 2 shows a strained silicon MOSFET device.
Figure 3:
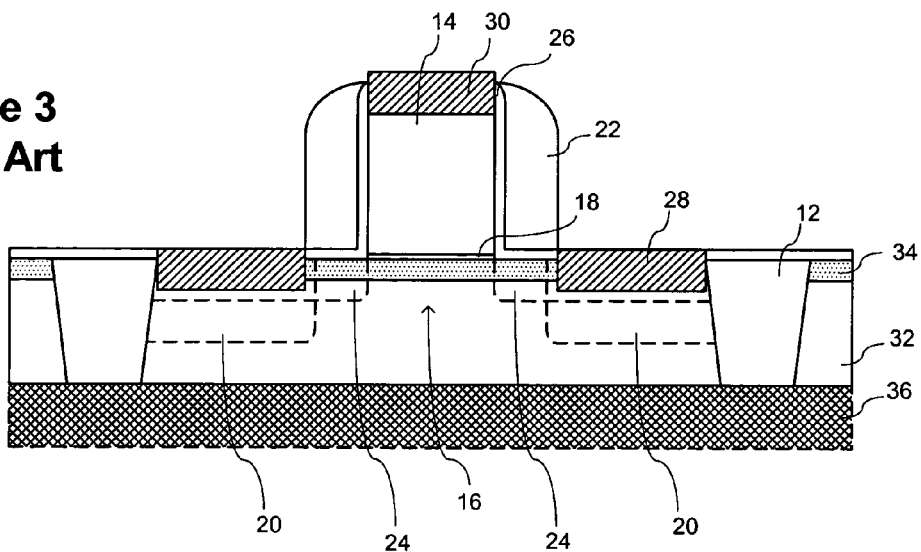
FIG. 3 shows a strained silicon MOSFET device formed on an SOI substrate.
Figure 4A:
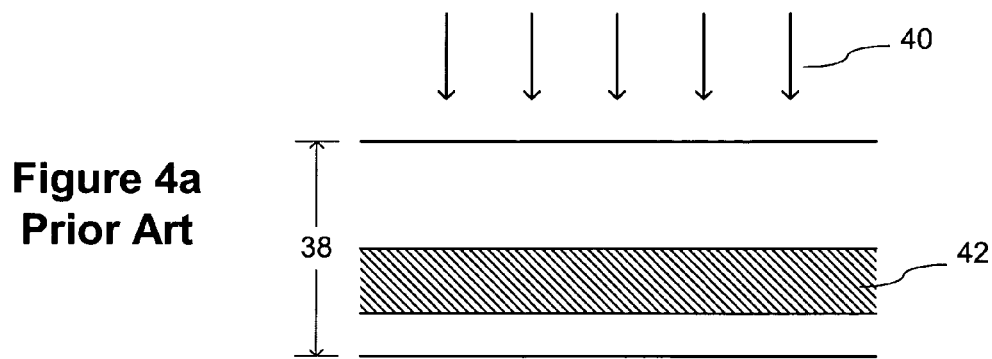
FIGS. 4a, 4b, 4c and 4d show the formation of a SOI substrate by a wafer bonding method.
Figure 4B:
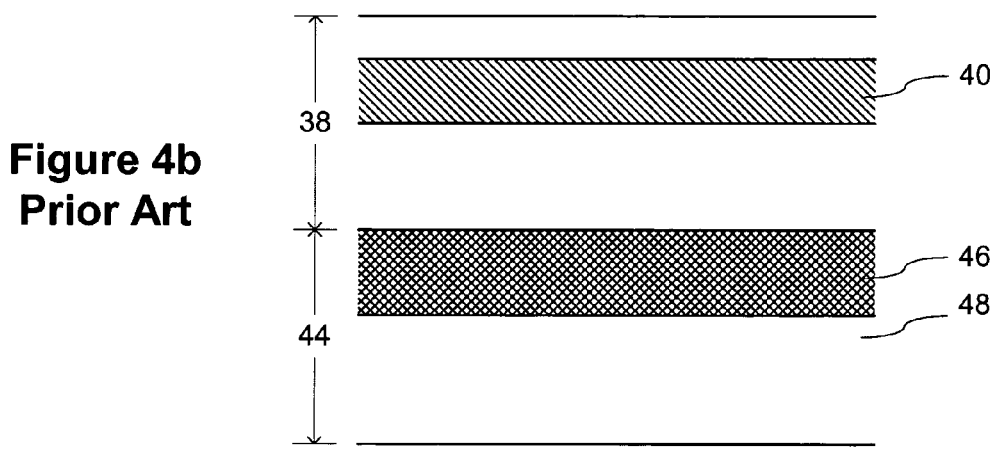
Figure 4C:
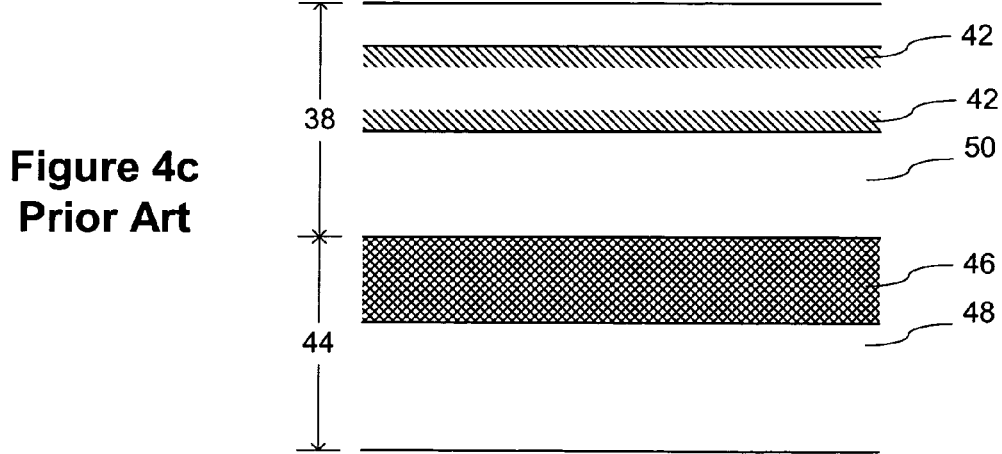
Figure 4D:
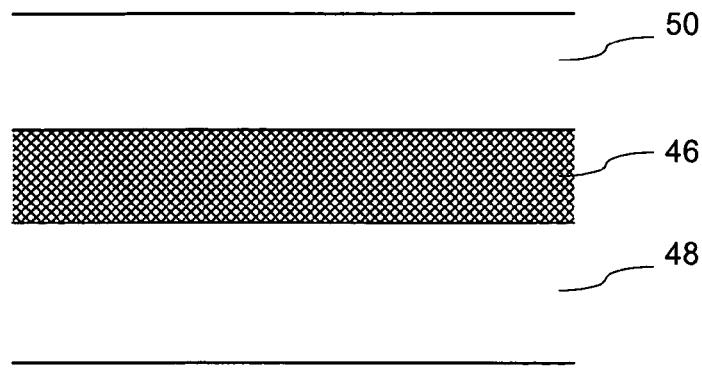
Figure 5A:
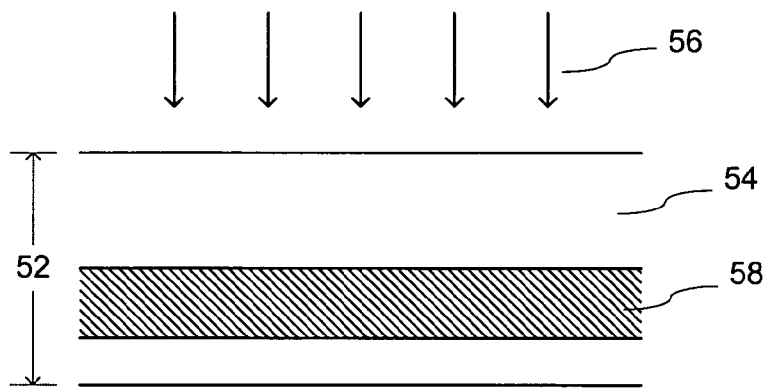
FIGS. 5a, 5b, 5c, 5d and 5e show the formation of a SOI substrate by a wafer bonding method in accordance with a preferred embodiment.

FIGS. 5a–5e show structures formed during processing in accordance with a first preferred embodiment to form a strained silicon SOI substrate in which a strained silicon is bonded to a dielectric layer and a layer of silicon germanium overlies the strained silicon layer. FIG. 5a shows a first substrate 52 that includes a planarized layer of silicon germanium 54. The silicon germanium is typically grown on a silicon wafer (not shown). The silicon germanium layer 54 has a composition $Si_{1-x}Ge_x$, where x is preferably approximately 0.3, and is more generally in the range of 0.1 to 0.4. The silicon germanium layer 54 may be grown on a silicon wafer, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. $SiH_4$ (silane) may be used as a source of silicon in alternative processes. The upper portion of the silicon germanium layer 54 should have an essentially uniform composition and should be as close as possible to planar. To achieve a near-planar surface, the silicon germanium layer may be polished by chemical mechanical polishing (CMP), stripped of oxide and then subjected to regrowth of a thin layer of silicon germanium.

The silicon germanium 54 is implanted with hydrogen 56 to form a hydrogen rich region 58 within the silicon germanium material. The hydrogen 56 is implanted with an energy such that the amount of silicon remaining above the hydrogen rich region exceeds the thickness of the silicon germanium layer to be formed on the SOI substrate. In some applications a different material such as oxygen may be implanted.

Figure 5B:
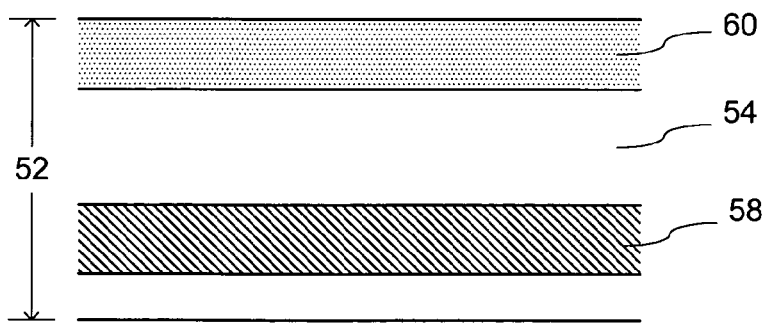

FIG. 5b shows the structure of FIG. 5a after growth of a strained silicon layer 60 on the silicon germanium layer 54. The strained silicon 60 is preferably grown by chemical vapor deposition using $Si_2H_6$ as a source gas with a partial pressure of 30 mPa and a substrate temperature of approximately 600 to 900 degrees C., and is grown for a sufficient time to fill the trench to approximately the level of the surface of the silicon germanium layer 54. To form fully depleted SOI devices the strained silicon layer 60 is typically left undoped, however doping may be performed in accordance with the particular implementation.

Figure 5C:
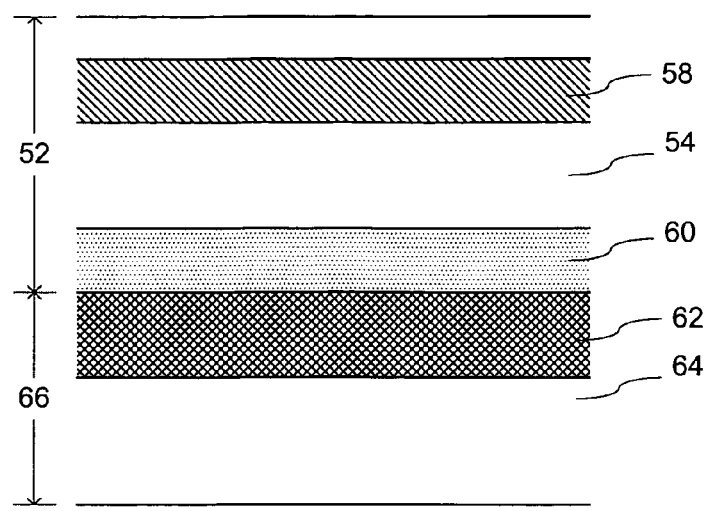

FIG. 5c shows the structure of FIG. 5b after being cleaned, stripped of oxide in a diluted HF solution, rinsed in deionized water to form an active native oxide on the surface of the strained silicon, and then inverted and bonded to a planarized dielectric layer 62 formed on a semiconductor layer 64 of a second substrate 66. The dielectric layer 64 is typically silicon oxide. To facilitate bonding, adjoining surfaces of the substrates are planarized to a homogeneity of 0.5 microns or less.

Figure 5D:
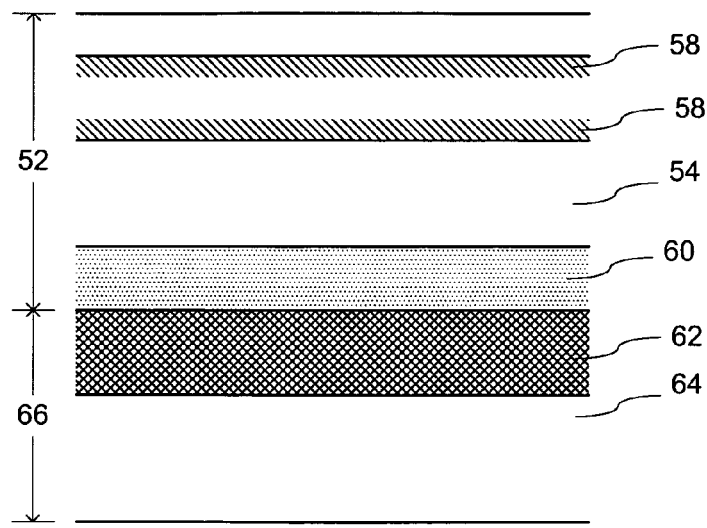
Figure 5E:
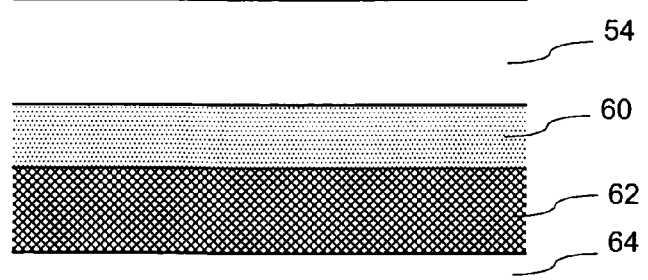

Bonding is generally performed in two stages. In a first stage, the substrates are heated to approximately 600 degrees C. in an inert environment for approximately three hours. As shown in FIG. 5d, the heating of the first stage causes bonding of the strained silicon layer 60 to the dielectric layer 62 of the second substrate 66 due to Van der Waals forces. The heating of the first stage also causes the silicon germanium layer 54 to fracture in the hydrogen rich region 58. After the first heating stage the fractured portion of the silicon germanium layer may be removed, leaving a new substrate comprising a silicon germanium layer 54 formed over a strained silicon layer 60 that is bonded to a dielectric layer 62, with a residual hydrogen rich region 58 at the upper surface of the silicon germanium layer 54. In a second stage of the bonding process, the bonded structure is heated to approximately 1050–1200 degrees C. for 30 minutes to two hours to strengthen the bond between the dielectric layer 62 and the strained silicon layer 60. The resulting substrate is then planarized and cleaned, leaving a silicon germanium SOI substrate as shown in FIG. 5e.

While the substrate formed in accordance with FIGS. 5a–5e typically employs a silicon oxide dielectric layer, in other embodiments the dielectric layer 54 may be formed of a different material. In accordance with one preferred alternative, the dielectric layer is formed of a dielectric material that can provide a crystal lattice mismatch which will apply strain in an amount similar to the strain applied by SiGe, thus allowing the dielectric material to impart strain to the strained silicon layer. Examples of dielectrics that may be used for this purpose include $DyScO_3$ and $GdScO_3$.

Accordingly an SOI substrate in accordance with embodiments of the invention may be implemented in a number of manners. In general terms, SOI substrates in accordance with embodiments of the invention comprise a strained silicon layer sandwiched between a dielectric layer and a silicon germanium layer.

Figure 7:
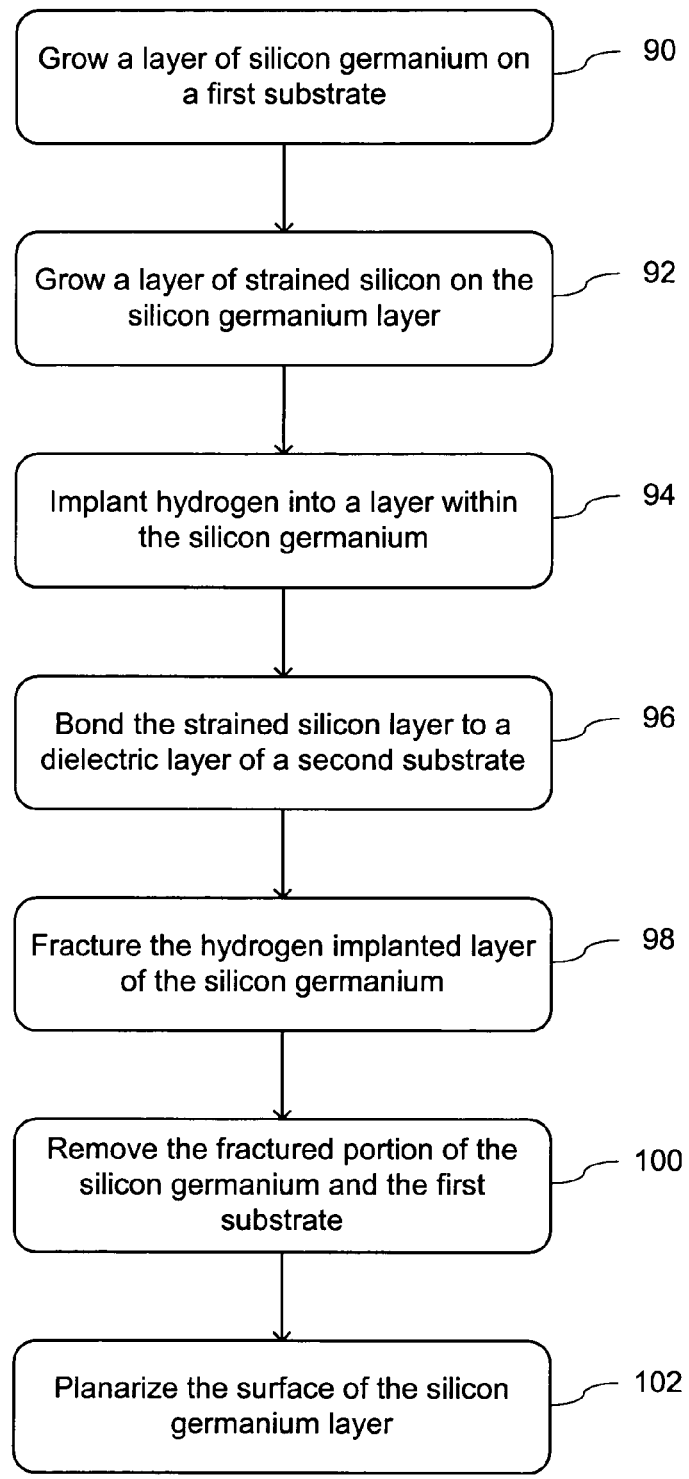
FIG. 7 shows a process flow encompassing the formation of an SOI substrate in accordance with the first preferred embodiment and alternative embodiments.

A process flow encompassing the formation of an SOI substrate in accordance with the embodiment of FIGS. 5a–5e and alternative embodiment is shown in FIG. 7. Initially a layer of silicon germanium is grown in a first substrate (90). A layer of strained silicon is then grown on the silicon germanium layer (92), and hydrogen is implanted into the silicon germanium to create a hydrogen implanted layer (94). The strained silicon layer is then bonded to a dielectric layer of a second substrate (96), and the silicon germanium layer is fractured at the hydrogen implanted layer (98). The fractured portion is removed (100), and the surface of the silicon germanium layer is planarized (102).

Figure 6A:
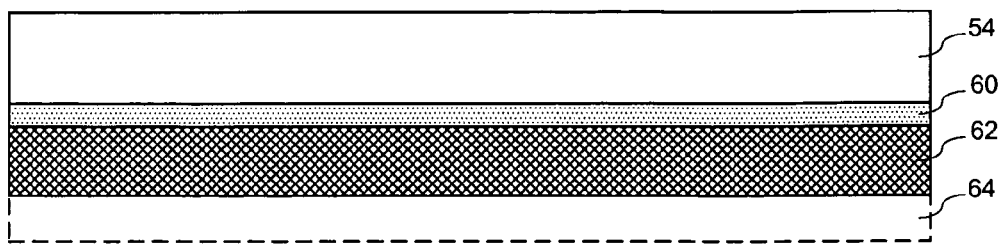
FIGS. 6a, 6b, 6c, 6d, 6e, 6f, 6g, 6h and 6i show structures formed during production of a strained silicon SOI MOSFET device in accordance with a preferred embodiment of the invention.

FIGS. 6a–6i show structures formed during fabrication of a strained silicon SOI MOSFET in accordance with a preferred embodiment of the invention. FIG. 6a shows an SOI substrate such as the one fabricated in accordance with FIGS. 5a–5e. The substrate is comprised of a semiconductor layer 64 having an overlying dielectric layer 62. A strained silicon layer 60 overlies the dielectric layer 62, and a silicon germanium layer 54 overlies the strained silicon layer 60.

Figure 6B:
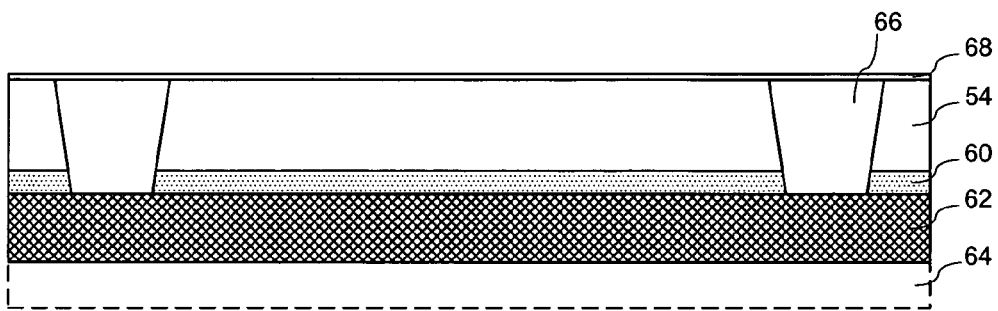

FIG. 6b shows the structure of FIG. 6a after formation of shallow trench isolations 66 in the silicon germanium 54 and strained silicon 60 layers, followed by formation of a protective oxide layer 68 over the silicon germanium layer 54. The shallow trench isolations 66 define an active region of the substrate in which a MOSFET will be formed. The shallow trench isolations 66 may be formed by forming trenches in the silicon germanium and strained silicon layers, performing a brief thermal oxidation, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process. In accordance with one preferred alternative, the shallow trench isolations are comprised of an oxide trench liner and a silicon carbide bulk fill material. The silicon carbide bulk fill material has high thermal conductivity and provides dissipation of heat generated in the active regions.

The protective oxide layer 68 may be grown by oxidizing the silicon germanium layer 54. During oxidation, germanium from the silicon germanium layer 54 segregates at the boundary of the oxide 68 with the silicon germanium layer 54, leaving a silicon oxide layer.

Figure 6C:
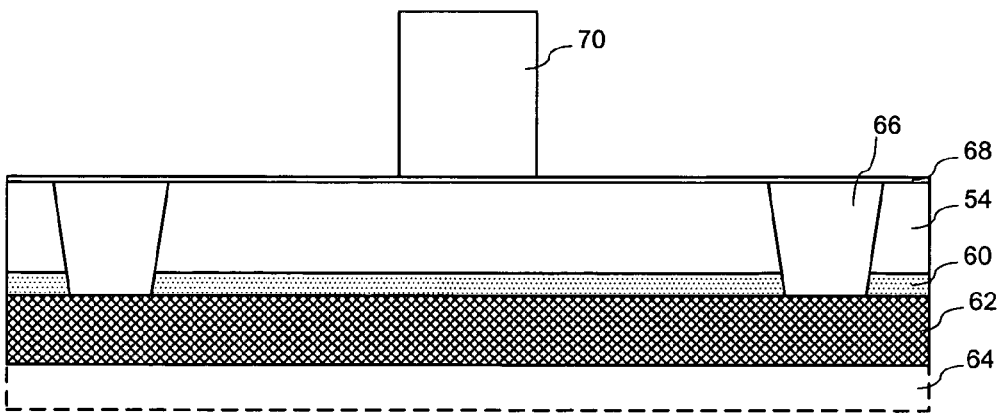

FIG. 6c shows the structure of FIG. 6b after formation of a sacrificial dummy gate 70 on the protective oxide 68 in the center of the active region defined by the shallow trench isolations 66. In the preferred embodiment the dummy gate 70 is patterned from a layer of polysilicon. However, a variety of other sacrificial materials such as amorphous carbon may be used for the dummy gate.

Figure 6D:
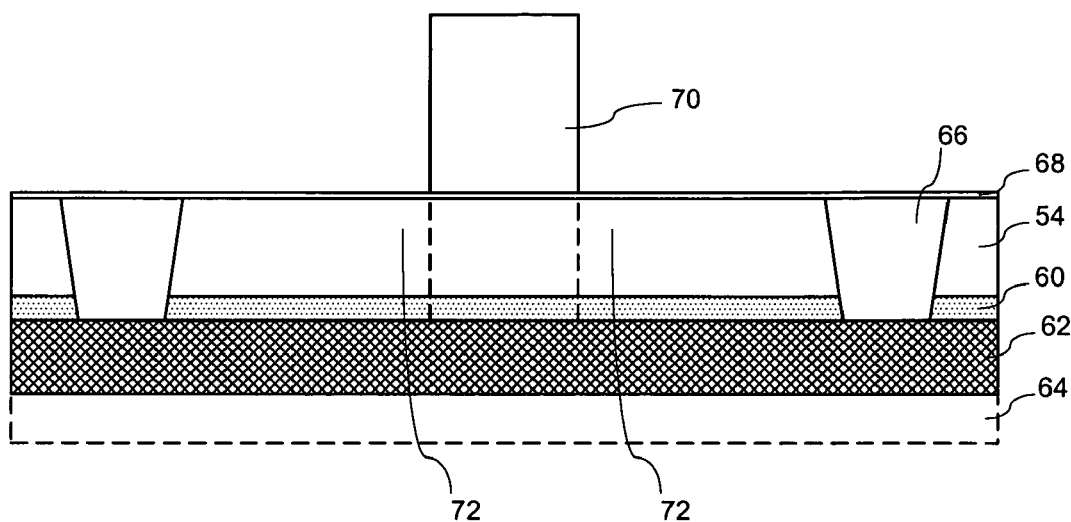

FIG. 6d shows the structure of FIG. 6c after implantation of dopant by ion implantation to form source and drain regions 72 in the silicon germanium layer 54 and strained silicon layer 60 at opposing sides of the dummy gate 70. The dummy gate 70 serves to mask the channel region during this implantation. The source and drain regions 72 shown in FIG. 6d are formed using an implantation direction that is essentially perpendicular to the surface of the substrate. In alternative implementations the implantation may be performed at an angle to the surface so that the implanted species extends beneath the dummy gate. As discussed below, later processing removes all material beneath the dummy gate except for the strained silicon material. Consequently, where an angled source/drain implant is used, the final structures will have source and drain extensions within the strained silicon channel. Such a structure may be desirable in implementations that use a thick trench sidewall spacer so that appropriate locations of the channel depletion regions relative to the gate electrode are maintained.

Figure 6E:
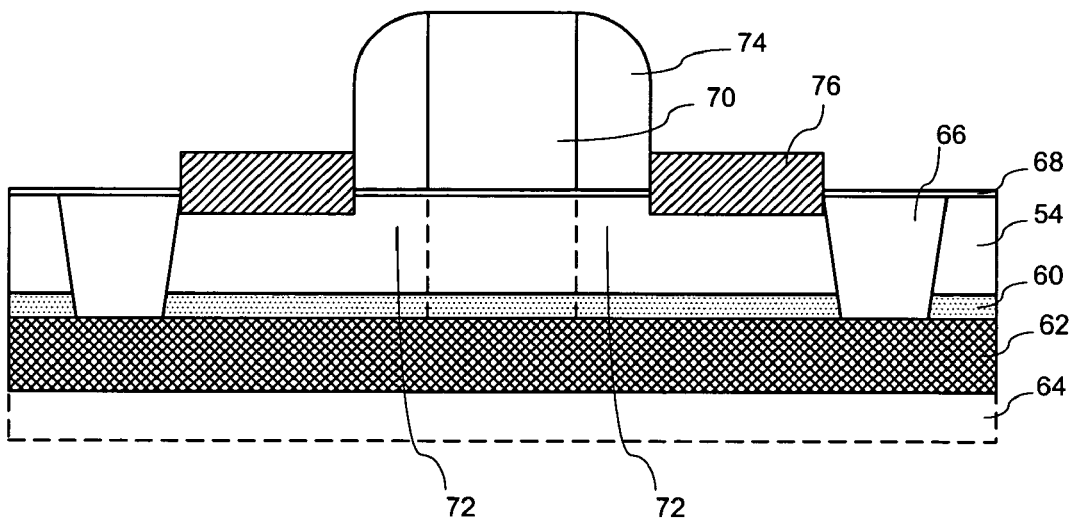

FIG. 6e shows the structure of FIG. 6d after formation of a spacer 74 around the dummy gate 70, followed by formation of source and drain silicides 76. The spacer is typically formed of silicon oxide that is blanket deposited and subjected to an anisotropic etch-back. The silicides 76 are formed of a compound comprising a semiconductor material and a metal. Typically a metal such as cobalt (Co) is used, however other metals such as nickel (Ni) may also be employed. The silicides 76 are formed by depositing a thin conformal layer of the metal over the entire structure, and then annealing to promote silicide formation at the points of contact between the metal and underlying semiconductor materials, followed by stripping of residual metal. Formation of silicides is typically preceded by a patterning step to remove oxides and protective layers from portions of the source and drain regions where the silicides are to be formed.

Figure 6F:
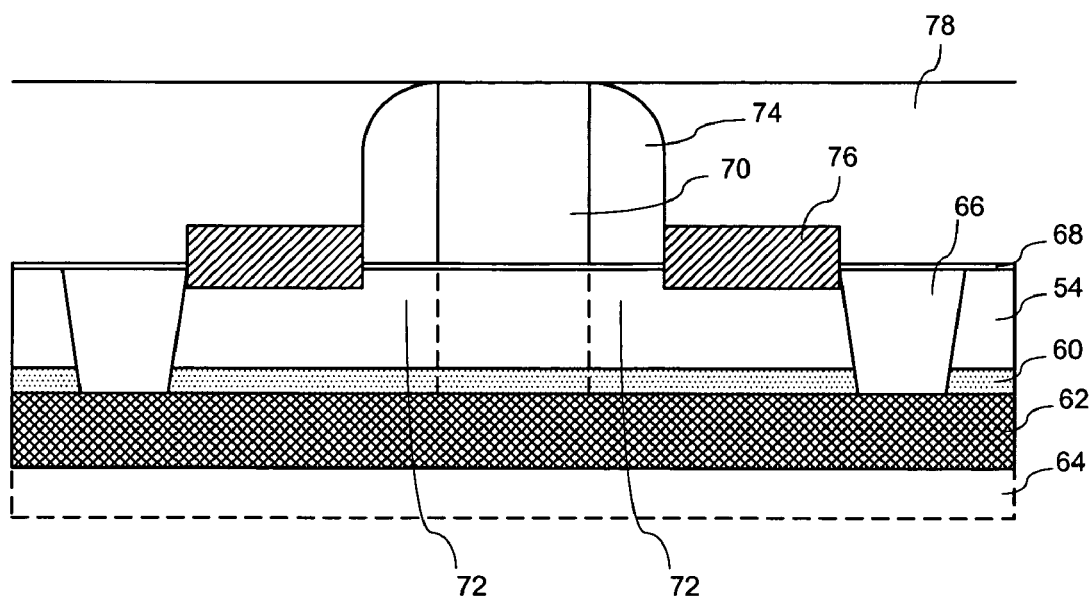

FIG. 6f shows the structure of FIG. 6e after deposition of a conformal protective oxide layer 78 over the MOSFET elements of FIG. 6e, followed by planarization of the protective oxide layer 78 to expose the dummy gate 74.

Figure 6G:
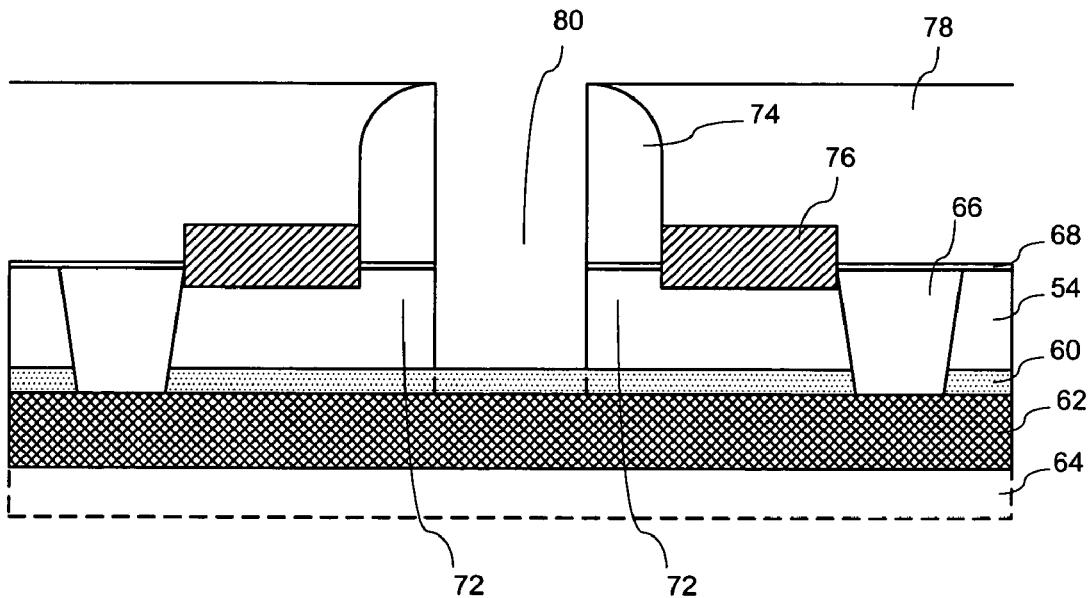

FIG. 6g shows the structure of FIG. 6f after removal of the dummy gate, followed by removal of the protective layer 66 beneath the dummy gate and etching of a trench 80 in the silicon germanium layer 54 to expose the strained silicon layer 60. The trench 80 is self aligned with respect to the spacer 72, and extends to the dielectric layer 60. The dummy gate is first removed using a conventional silicon etchant. The protective oxide layer may then be removed by a wet etch in dilute HF or a $CF_4/Ar$ plasma etch. The trench in the silicon germanium layer may then be etched using an isotropic etch process such as $CF_4$ based chemistry, $SF_6$, $SF_6/H_2/CF_4$, $CF_2Cl_2$, or HBr.

Figure 6H:
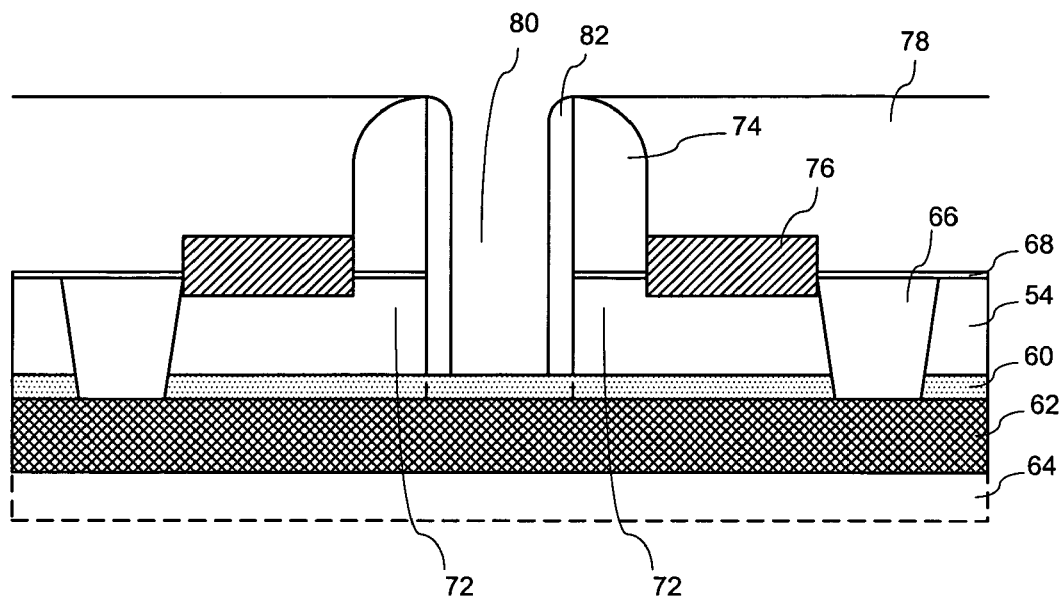

FIG. 6h shows the structure of FIG. 6g after formation of a spacer 82 within the trench 80. The spacer 82 is preferably a silicon oxide spacer 82 within the trench 80. The spacer is typically formed by blanket deposition of silicon oxide followed by etch-back to expose the strained silicon a the bottom of the trench. The spacer 82 narrows the trench and thus allows the channel length at the bottom of the trench to be controlled. The spacer 82 also defines an insulated space within which to form a gate electrode.

Figure 6I:
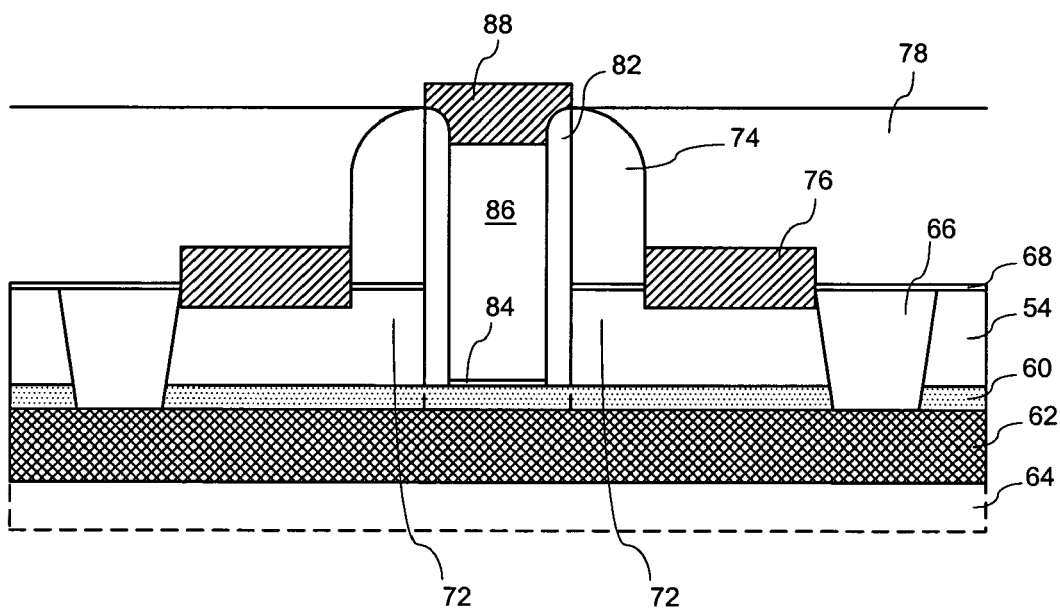

FIG. 6i shows the structure of FIG. 6h after formation of a gate insulator 84 on the strained silicon at the bottom of the trench, followed by formation of a gate 86 within the trench and formation of a gate silicide 88. The gate insulator 84 is typically formed by thermal oxidation of the strained silicon 60. The gate 86 is typically formed by damascene processing using polysilicon, which may be doped in situ during growth or by implantation after growth. The gate silicide 88 is formed in a manner similar to the source and drain suicides 76.

The structure of FIG. 6i is advantageous as compared to conventional structures in that the strained silicon layer is protected between the silicon germanium layer and the dielectric layer during much of the processing, and therefore strain relaxation during processing is reduced. In addition, this structure enables the formation of a strained silicon SOI device with a thin, fully depleted channel region.

The processing of FIGS. 6a–6i represents a presently preferred embodiment, however alternative embodiments may implement different processing to achieve similar goals. A variety of embodiments of an SOI MOSFET may be implemented in accordance with the invention. In general terms, embodiments of the invention are implemented as a strained silicon SOI MOSFET formed on a substrate comprising a strained silicon layer sandwiched between a dielectric layer and a layer of silicon germanium. The MOSFET includes a gate electrode that extends through the silicon germanium layer to a channel region formed in the strained silicon layer between the MOSFET source and drain regions. The MOSFET may be formed in a fully depleted state by using a strained silicon layer of appropriate thickness.

Figure 8:
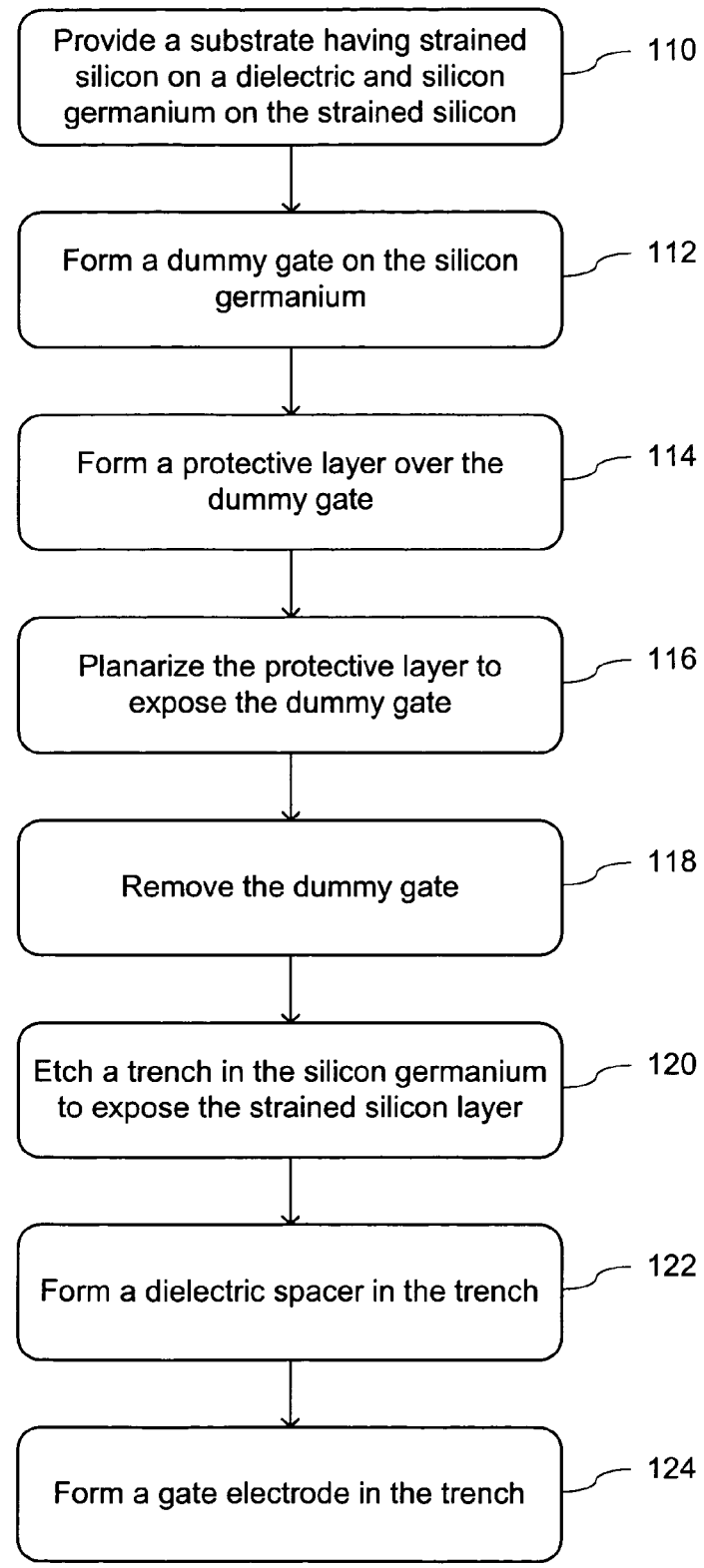
FIG. 8 shows a process flow encompassing the formation of an SOI MOSFET in accordance with the first preferred embodiment and alternative embodiments.

FIG. 8 shows a process flow encompassing the processing of FIGS. 6a–6i, the aforementioned alternatives, and other alternatives. Initially a substrate is provided (110). The substrate comprises a strained silicon layer formed on a dielectric layer and a silicon germanium layer formed on the strained silicon layer. A dummy gate is formed on the silicon germanium layer (112) and a protective layer is formed over the dummy gate (114). The protective layer is planarized to expose the dummy gate (116), and the dummy gate is then removed (118). A trench is etched in the silicon germanium layer at the location of the dummy gate to expose the strained silicon layer (120), and a dielectric spacer is formed in the trench (122). A gate insulator is then formed on the strained silicon (124) and a gate electrode is formed on the gate insulator (126).

The tasks described in the above processes are not necessarily exclusive of other tasks, and further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the processes described herein need not be performed on an entire substrate such as an entire wafer, but may instead be performed selectively on sections of the substrate. Also, while tasks performed during the fabrication of structure described herein are shown as occurring in a particular order for purposes of example, in some instances the tasks may be performed in alternative orders while still achieving the purpose of the process. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for the formation of a semiconductor on insulator (SOI) device, comprising:
    providing a substrate comprising a layer of strained silicon sandwiched between a dielectric layer and a silicon germanium layer;
    forming a dummy gate on the silicon germanium layer;
    forming a protective layer over the dummy gate;
    planarizing the protective layer to expose the dummy gate;
    removing the dummy gate;
    etching a trench in the silicon germanium layer at the location of the dummy gate to expose the strained silicon layer;
    forming a dielectric spacer in the trench;
    forming a gate insulator on the strained silicon in the trench; and
    forming a gate electrode in the trench.

2. The method claimed in claim 1, wherein the dielectric material is one of $DyScO_3$ and $GdScO_3$.

3. The method claimed in claim 1, wherein the strained silicon channel region has a thickness such that the device is in a fully depleted state.

4. The method claimed in claim 1, further comprising shallow trench isolations extending through the layers of the strained silicon and the silicon germanium to define an active region in which a source and drain region and the gate electrode are formed.

5. The method claimed in claim 1, wherein the substrate further comprises a spacer surrounding the dummy gate, and wherein the trench is self-aligned with the spacer.

6. The method claimed in claim 1, wherein the substrate further comprises source and drain silicides formed on a deep source and drain region.

7. The method claimed in claim 1, wherein the dummy gate is comprised of amorphous carbon.

8. The method claimed in claim 7, wherein the dummy gate is removed by ashing the amorphous carbon in an oxygen atmosphere.

9. The method claimed in claim 1, wherein the dummy gate is comprised of polysilicon.

10. The method claimed in claim 1, wherein providing the substrate comprises:
    growing a layer of the silicon germanium on a first substrate;
    growing a layer of the strained silicon on the silicon germanium layer;
    implanting hydrogen into the silicon germanium layer to create a hydrogen implanted layer;
    bonding the strained silicon layer to the dielectric layer of a second substrate;
    fracturing the silicon germanium layer at the hydrogen implanted layer;
    removing a portion comprising the first substrate and a fractured portion of the silicon germanium layer; and
    planarizing a surface of the remaining portion of the silicon germanium layer.

11. The method claimed in claim 1, wherein forming the protective layer is preceded by implanting a source and drain region at opposing sides of the dummy gate.

12. The method claimed in claim 11, wherein the source and drain region species are implanted at an angle with respect to the substrate such that the implanted species extend into a region of the strained silicon layer beneath the dummy gate.

* * * * *